United States Patent
Zhang et al.

(10) Patent No.: US 9,847,361 B2
(45) Date of Patent: Dec. 19, 2017

(54) PIXEL CELL, IMAGE SENSOR, AND MANUFACTURING METHOD

(71) Applicant: BYD COMPANY LIMITED, Shenzhen (CN)

(72) Inventors: Caiting Zhang, Shenzhen (CN); Kun Liu, Shenzhen (CN); Jingjun Fu, Shenzhen (CN); Wenge Hu, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 181 days.

(21) Appl. No.: 14/430,097

(22) PCT Filed: Oct. 15, 2013

(86) PCT No.: PCT/CN2013/085252
§ 371 (c)(1),
(2) Date: Mar. 20, 2015

(87) PCT Pub. No.: WO2014/059920
PCT Pub. Date: Apr. 24, 2014

(65) Prior Publication Data
US 2015/0249101 A1     Sep. 3, 2015

(30) Foreign Application Priority Data

Oct. 19, 2012 (CN) .......................... 2012 1 0401338
Jun. 24, 2013 (CN) .......................... 2013 1 0251026

(51) Int. Cl.
*H01L 27/14* (2006.01)
*H01L 27/146* (2006.01)
*H04N 5/378* (2011.01)

(52) U.S. Cl.
CPC .... *H01L 27/1461* (2013.01); *H01L 27/14616* (2013.01); *H01L 27/14643* (2013.01); *H01L 27/14683* (2013.01); *H01L 27/14698* (2013.01); *H04N 5/378* (2013.01)

(58) Field of Classification Search
CPC ................ H04N 5/378; H01L 27/1461; H01L 27/14616; H01L 27/14643; H01L 27/14683; H01L 27/14698
See application file for complete search history.

(56) References Cited

U.S. PATENT DOCUMENTS

2005/0051701 A1    3/2005   Hong
2006/0181626 A1    8/2006   Lee
2006/0240601 A1   10/2006   Nagaraja
(Continued)

FOREIGN PATENT DOCUMENTS

WO      2011161909 A1    12/2011

*Primary Examiner* — Francis M Legasse, Jr.
(74) *Attorney, Agent, or Firm* — Anova Law Group, PLLC

(57) ABSTRACT

A pixel cell, a method for manufacturing the same and an image sensor including the same are provided. The pixel cell includes: a substrate; a photodiode, a pass transistor and a floating diffusion structure respectively formed on the substrate, in which the pass transistor is formed between the photodiode and the floating diffusion structure; and a PINNED structure, formed on the substrate and connected with the floating diffusion structure, in which a reset voltage of the floating diffusion structure is higher than a depletion voltage of the PINNED structure.

12 Claims, 5 Drawing Sheets

(56) References Cited

U.S. PATENT DOCUMENTS

| | | |
|---|---|---|
| 2006/0284054 A1 | 12/2006 | Asaba |
| 2007/0114629 A1 | 5/2007 | Dosluoglu et al. |
| 2007/0158771 A1* | 7/2007 | Hynecek ........... H01L 27/14603 257/431 |
| 2008/0042229 A1 | 2/2008 | Lim |
| 2011/0309236 A1* | 12/2011 | Tian ................. H01L 27/14603 250/208.1 |

* cited by examiner

PIXEL CELL, IMAGE SENSOR, AND MANUFACTURING METHOD

CROSS-REFERENCE TO RELATED APPLICATIONS

This application is a national phase entry under 35 U.S.C. §371 of International Application No. PCT/CN2013/085252, filed on Oct. 15, 2013, which claims priority to and benefits of Chinese Patent Application Serial No. 201210401338.9, filed with the State Intellectual Property Office of P. R. C. on Oct. 19, 2012, and Chinese Patent Application Serial No. 201310251026.9, filed with the State Intellectual Property Office of P. R. C. on Jun. 24, 2013, the entire contents of which are incorporated herein by reference

TECHNICAL FIELD

Exemplary embodiments of the present disclosure relate generally to a semiconductor device manufacturing field and, more particularly, to a pixel cell, a method for manufacturing the same, and an image sensor comprising the same.

BACKGROUND

Recently, performance of image sensors becomes better and better, and size of chips in the image sensors becomes smaller and smaller. As the pixel size decreases, cost decreases greatly, whereas some performance such as dynamic range, sensitivity, signal-to-noise ratio can be limited. In order to improve the dynamic range of the chip, a pixel cell comprising a large pixel and a small pixel is often used. Similarly, a pixel cell comprising a large FD (floating diffusion) pixel and a small FD pixel is also often used. For the image sensor using the pixel cell comprising the large and small pixels, the large pixel has a high sensitivity and can sense an object with a low illuminance, and the small pixel has a low sensitivity and is used to sense an object with a high illuminance. Thus, an image obtained by this kind of image sensor includes image information of the large and small pixels, and corresponds to a composite image of the images obtained under a high sensitivity (large pixel) condition and a low sensitivity (small pixel) condition, thus reflecting more information under the low illuminance and high illuminance. Therefore, the pixel cell comprising the large and small pixels can realize a wide dynamic range of the image sensor. However, in order to realize the same resolution as the conventional image sensor, the size of the chip in the above image sensor must be increased, thus reducing cost performance.

SUMMARY

Embodiments of the present disclosure seek to solve at least one of the above problems.

According to a first aspect of the present disclosure, a pixel cell is provided. The pixel cell comprises: a substrate; a photodiode, a pass transistor and a floating diffusion structure respectively formed on the substrate, in which the pass transistor is formed between the photodiode and the floating diffusion structure; and a PINNED structure (a structure formed in the substrate by sandwiching an N-type region between two layers of P-type regions or a P-type region between two layers of N-type regions), formed on the substrate and connected with the floating diffusion structure, in which a reset voltage of the floating diffusion structure is higher than a depletion voltage of the PINNED structure.

With the pixel cell according to the embodiments of the present disclosure, by forming the PINNED structure in a region connected with the floating diffusion structure and by controlling the depletion voltage of the PINNED structure, a nonlinear sensitivity of an image sensor having the pixel cell is realized. Specifically, when an exposure time is short, the sensitivity of the image sensor is high. When the exposure time is long, carriers generated by the photodiode are transferred into the floating diffusion structure, and then when the voltage of the floating diffusion structure is lower than the depletion voltage of the PINNED structure, the carriers in the floating diffusion structure are transferred into the PINNED structure, which makes the sensitivity of the image sensor lower, thus realizing the nonlinear sensitivity of the image sensor. Furthermore, with the pixel cell according to embodiments of the present disclosure, it is possible to not only improve control of the image sensor on an over-exposure region, but also improve visibility of a dark-state region, thus increasing the dynamic range of the image sensor.

According to a second aspect of the present disclosure, a method for manufacturing a pixel cell is provided. The method comprises: providing a substrate; and forming a photodiode, a pass transistor, a floating diffusion structure and a PINNED structure on the substrate respectively, in which the pass transistor is formed between the photodiode and the floating diffusion structure, the floating diffusion structure is connected with the PINNED structure, and a reset voltage of the floating diffusion structure is higher than a depletion voltage of the PINNED structure.

With the method for manufacturing the pixel cell according to embodiments of the present disclosure, by forming the PINNED structure in the region connected with the floating diffusion structure and by controlling the depletion voltage of the PINNED structure, the nonlinear sensitivity of the image sensor is realized and the dynamic range of the image sensor is improved. In addition, the method for manufacturing the pixel cell according to embodiments of the present disclosure is simple to carry out and is compatible with conventional CMOS manufacture methods.

According to a third aspect of the present disclosure, an image sensor is provided. The image sensor comprises: a pixel array, comprising a plurality of pixel cells according to the first aspect of the present disclosure arranged in a plurality of rows and columns; a column decoder and a row decoder, connected with the pixel array respectively and configured to select a pixel cell from the plurality of pixel cells; a readout circuit, connected with the pixel array and configured to read a voltage of the pixel cell selected by the column decoder and the row decoder; a front-end processing circuit, connected with the readout circuit and configured to process the voltage of the pixel cell to obtain a processed analog voltage; a converter, connected with the front-end processing circuit and configured to convert the processed analog voltage into digital data; and an image signal processing circuit, connected with the converter and configured to process the digital data to obtain an image signal.

With the image sensor according to embodiments of the present disclosure, by using the pixel array comprising the plurality of pixel cells having the PINNED structure, the nonlinear sensitivity of the image sensor is realized. Moreover, the control of the image sensor on the over-exposure region is enhanced, and the visibility of the dark-state region is improved, thus enhancing the dynamic range of the image sensor.

In one embodiment of the present disclosure, the PINNED structure comprises a first diffusion region and a second diffusion region formed on the first diffusion region in a substrate. A doping type of the first diffusion region is opposite to that of the substrate. A doping type of the second diffusion region is the same as that of the substrate. A doping concentration of the second diffusion region is larger than that of the first diffusion region.

In one embodiment of the present disclosure, an area of the PINNED structure is larger than that of the floating diffusion structure.

In one embodiment of the present disclosure, a doping concentration of the floating diffusion structure is larger than that of the first diffusion region, and a doping type of the floating diffusion structure is opposite to that of the substrate.

According to the present disclosure, by controlling the doping concentration of the floating diffusion structure, the first diffusion region and the second diffusion region, the depletion voltage of the PINNED structure is lower than the reset voltage of the floating diffusion structure, so that an integral time for the sensitivity of the image sensor reaching a nonlinear state and a rate at which an output of the image sensor reaches a saturation state are controlled, thus realizing the control on the nonlinear sensitivity of the image sensor.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Figure 1:
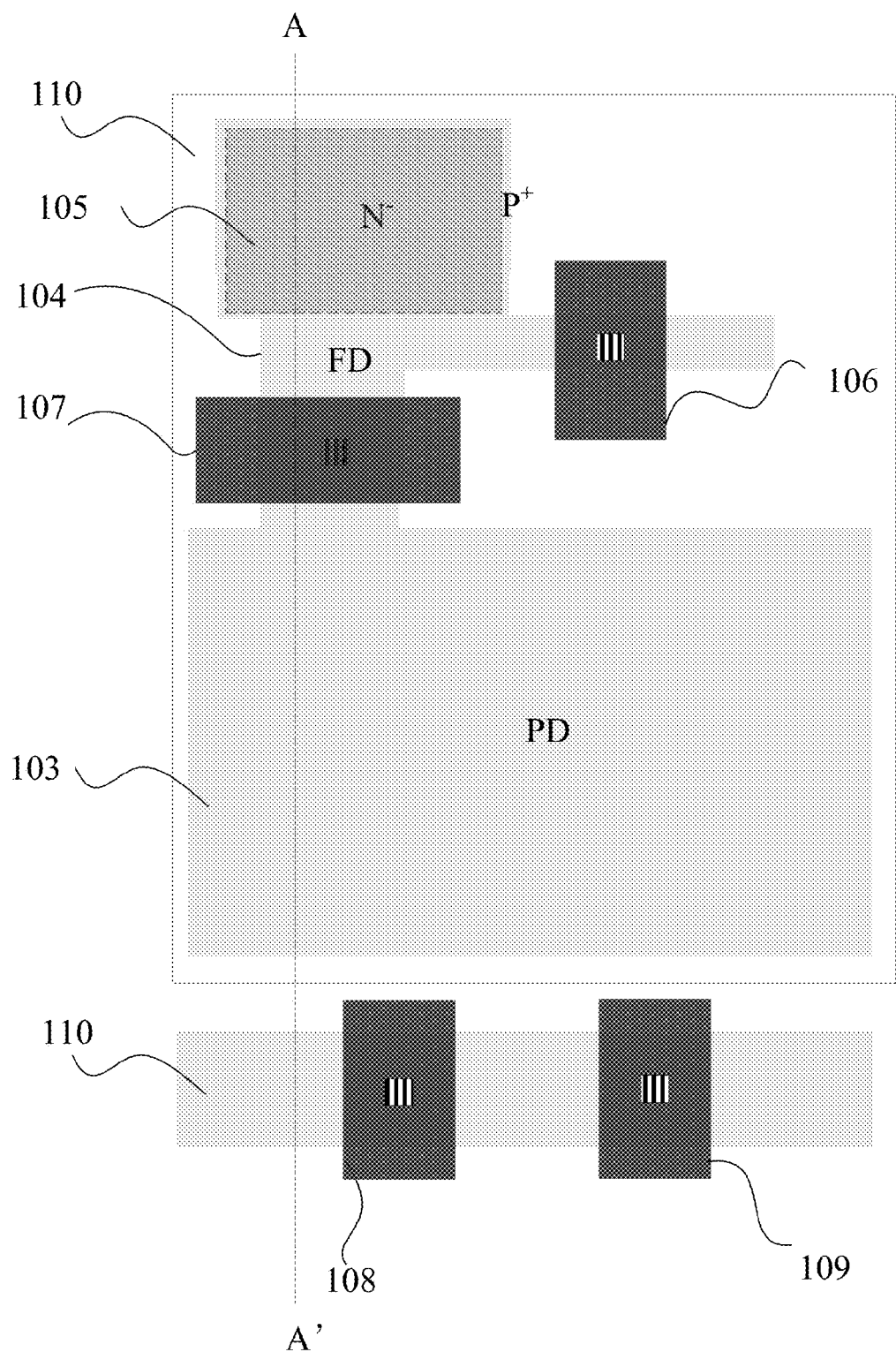
FIG. 1 is a plane layout view of a pixel cell according to an embodiment of the present disclosure.

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

In the description, terms concerning attachments, coupling and the like, such as "connected" and "interconnected", refer to a relationship in which structures are secured or attached to one another through mechanical or electrical connection, or directly or indirectly through intervening structures, unless expressly described otherwise. Specific implications of the above phraseology and terminology may be understood by those skilled in the art according to specific situations.

Figure 2:
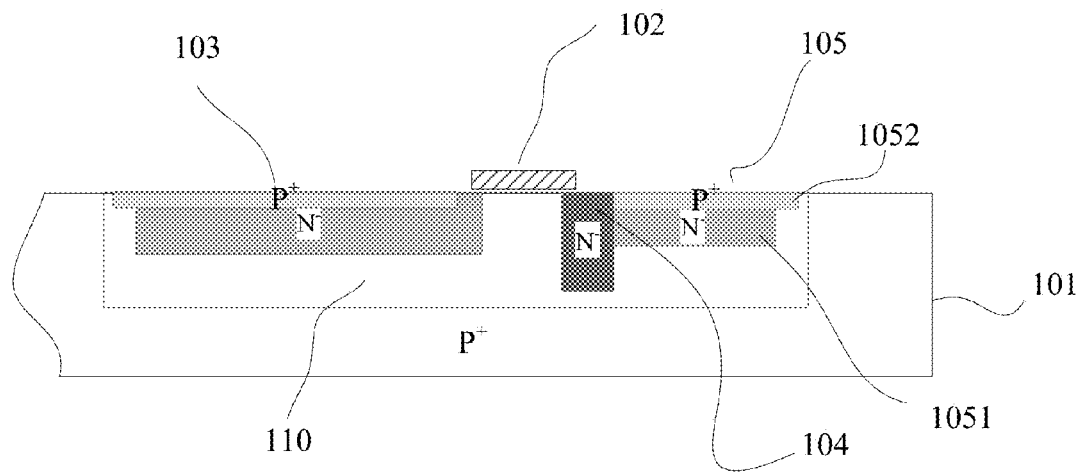
FIG. 2 is a sectional view of a pixel cell along an A-A' line in FIG. 1.

FIG. 1 is a plane layout view of a pixel cell according to an embodiment of the present disclosure. FIG. 2 is a sectional view of a pixel cell along an A-A' line in FIG. 1. As shown in FIGS. 1 and 2, the pixel cell comprises a substrate 101, a photodiode 103, a pass transistor 107, a floating diffusion structure 104, and a PINNED structure 105. The photodiode 103, the pass transistor 107, the floating diffusion structure 104 and the PINNED structure 105 are respectively formed on the substrate 101. The pass transistor 107 is formed between the photodiode 103 and the floating diffusion structure 104. When a voltage is applied to a gate 102 of the pass transistor 107, the pass transistor 107 is turned on, and then carriers in the photodiode 103 can be transferred to the floating diffusion structure 104. The PINNED structure 105 is connected with the floating diffusion structure 104, and a reset voltage of the floating diffusion structure 104 is higher than a depletion voltage of the PINNED structure 105.

A material of the substrate 101 may be any substrate material for fabricating a MOSFET. For example, the material of the substrate 101 may be, but is not limited to, SOI (silicon on insulator), Si (silicon), Ge (germanium), or GaAs (gallium arsenide). Advantageously, the material of the substrate 101 is Si.

In one embodiment of the present disclosure, a doping type of the floating diffusion structure 104 is opposite to that of the substrate 101, e.g., an N-type vs. a P-type, and the floating diffusion structure 104 is heavily doped. It should be understood that the term "heavily doped" means that the floating diffusion structure 104 is doped with a substantially high concentration, which is commonly used by those skilled in the art.

In one embodiment of the present disclosure, the PINNED structure 105 comprises a first diffusion region 1051 and a second diffusion region 1052. The first diffusion region 1051 is connected with the floating diffusion structure 104, and the second diffusion region 1052 is formed on the first diffusion region 1051. A doping type of the first diffusion region 1051 is opposite to that of the substrate 101, and a doping type of the second diffusion region 1052 is the same as that of the substrate 101. A doping concentration of the first diffusion region 1051 is lower than that of the floating diffusion structure 104, and a doping concentration of the second diffusion region 1052 is larger than that of the first diffusion region 1051. Thus, a potential well structure is formed between the floating diffusion structure 104 and the PINNED structure 105, and consequently it is possible to control the depletion voltage of the PINNED structure 105 to be higher than the voltage of the floating diffusion structure 104.

In one embodiment, a shape of the first diffusion region 1051 is the same as that of the second diffusion region 1052.

Further, the PINNED structure 105 may be of any shape. For example, the shape of the PINNED structure 105 may be, but is not limited to, a polygon, a circle, a shape formed with lines and arcs or a shape formed with irregular arcs. Alternatively, a shape of the first diffusion region 1051 may be different from that of the second diffusion region 1052. Similarly, the shape of the first diffusion region 1051 may be, but is not limited to, a polygon, a circle, a shape formed with lines and arcs or a shape formed with irregular arcs, and the shape of the second diffusion region 1052 may also be, but is not limited to, a polygon, a circle, a shape formed with lines and arcs or a shape formed with irregular arcs.

Furthermore, an area of the PINNED structure 105 is larger than that of the floating diffusion structure 104, i.e., either an area of the first diffusion region 1051 or an area of the second diffusion region 1052 is larger than that of the floating diffusion structure 104. It should be noted that the term "area" refers to a plane area. In one embodiment, a ratio of the area of the PINNED structure 105 to that of the floating diffusion structure 104 ranges from 5:1 to 10:1. A carrier density per unit area of the PINNED structure 105 is smaller than that of the floating diffusion structure 104. According to the present disclosure, by controlling the doping concentration of the floating diffusion structure 104, the first diffusion region 1051 and the second diffusion region 1052 and by controlling the ratio of the area of the PINNED structure 105 to that of the floating diffusion structure 104, a rate at which an output of the image sensor reaches a saturation state in the nonlinear sensitivity phase can be controlled, thus controlling the image sensor.

As shown in FIGS. 1 and 2, the doping type of the first diffusion region 1051 is n-type, and the doping concentration of the first diffusion region 1051 is 10e12/cm2. The doping type of the second diffusion region 1052 is p-type, and the doping concentration of the second diffusion region 1052 is 10e13/cm2. The doping type of the substrate 101 is p-type. A PNP structure is formed by the first diffusion region 1051, the second diffusion region 1052 and the substrate 101. A thickness of the second diffusion region 1052 is smaller than that of the first diffusion region 1051. A shape of the first diffusion region 1051 is the same as that of the second diffusion region 1052, i.e., the first diffusion region 1051 and the second diffusion region 1052 are rectangular. Both of the first diffusion region 1051 and the second diffusion region 1052 are formed on an active region 110, and the active region 110 is a region for performing doping in the substrate 101. It should be noted that, although not shown, the photodiode 103, the pass transistor 107 and the floating diffusion region 104 are also formed on the active region 110.

With the pixel cell according to embodiments of the present disclosure, by forming the PINNED structure 105 in the region connected with the floating diffusion structure 104 and controlling the doping concentration of the first diffusion region 1051 and the second diffusion region 1052, the depletion voltage of the PINNED structure 105 can be controlled to realize the nonlinear sensitivity of the image sensor. Specifically, when an exposure time is short, the sensitivity of the image sensor is high. When the exposure time is long, the signal electrons generated by the photodiode 103 are transferred into the floating diffusion structure 104, and when the voltage of the floating diffusion structure 104 is lower than the depletion voltage of the PINNED structure 105, the sensitivity of the image sensor becomes lower, thus realizing the nonlinear sensitivity of the image sensor. Furthermore, with the pixel cell according to embodiments of the present disclosure, it is possible to not only increase control of the image senor on an over-exposure region, but also enhance a visibility of a dark-state region, thus increasing a dynamic range of the image sensor.

Figure 3:
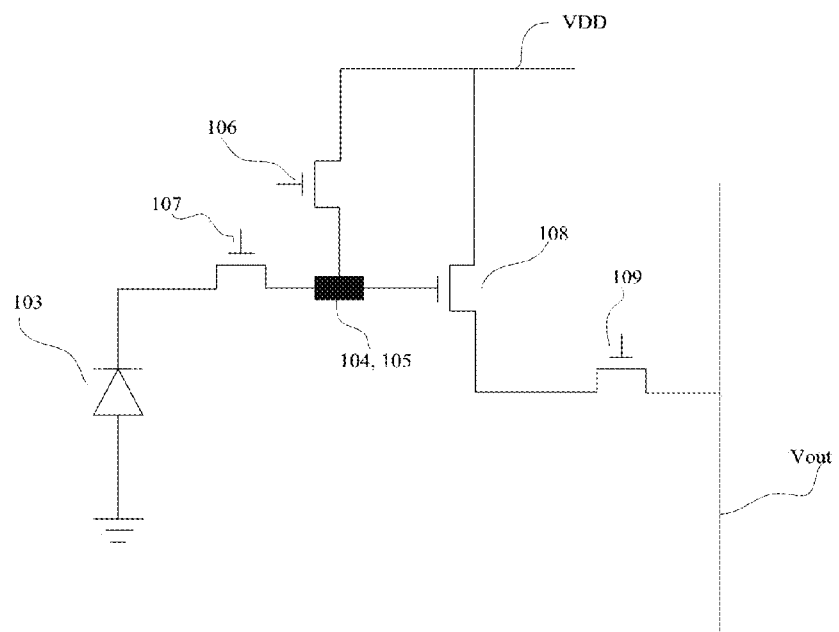
FIG. 3 is a circuit diagram of a pixel cell according to an embodiment of the present disclosure.

FIG. 3 is a circuit diagram of a pixel cell according to an embodiment of the present disclosure. The black region in FIG. 3 comprises the PINNED structure 105 and the floating diffusion structure 104 connected therewith. As shown in FIGS. 1-3, the pixel cell also comprises a resetting transistor 106, a source following transistor 108 and a row selected transistor 109, which are also formed on the active region 110. The photodiode 103 is connected with the floating diffusion structure 104 and the PINNED structure 105 via the pass transistor 107. The carriers in the photodiode 103 are transferred to the floating diffusion structure 104 and the PINNED structure 105 under a control of the pass transistor 107. The resetting transistor 106 is connected with the floating diffusion structure 104, and configured to reset the photodiode 103, the floating diffusion structure 104 and the PINNED structure 105, i.e., clear charges in the photodiode 103, the floating diffusion structure 104 and the PINNED structure 105. The source following transistor 108 is connected with the floating diffusion structure 104, and configured to amplify and buffer a signal collected from the floating diffusion structure 104. The row selected transistor 109 is connected with the source following transistor 108, and configured to output the signal processed by the source following transistor 108.

A signal collecting process of the pixel cell will be described in detail with reference to FIG. 3. As shown in FIG. 3, VDD is a voltage provided for the entire pixel cell, and a signal is provided by a control circuit to control the resetting transistor 106, the pass transistor 107 and the row selected transistor 109 to turn on or off so as to realize a collection of the output Vout. Specifically, the resetting transistor 106 firstly operates to clear the charges in the floating diffusion structure 104, the photodiode 103 and the PINNED structure 105, and then a voltage signal of the floating diffusion structure 104 is collected. Subsequently, the photodiode 103 is in operation, and the pass transistor 107 is turned on. Thus, the carriers in the photodiode 103 are transferred to the floating diffusion structure 104 or transferred to the floating diffusion structure 104 and the PINNED structure 105, and the voltage signal of the floating diffusion structure 104 is collected again. A difference between two collected voltage signals is a collected photoelectric signal. The source following transistor 108 amplifies and buffers the difference between the two collected voltage signals to obtain a processed photoelectric signal, and then the row selected transistor 109 outputs the processed photoelectric signal.

Figure 4:
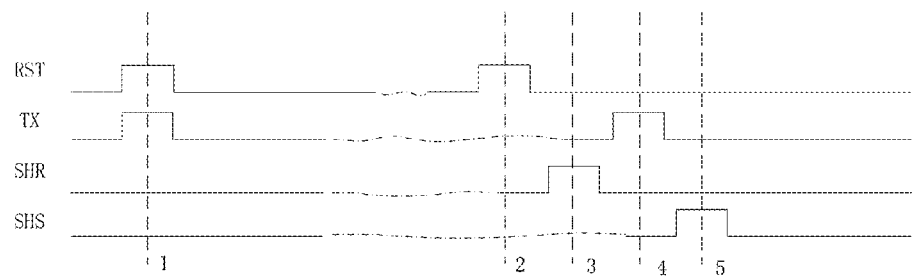
FIG. 4 is a time sequence diagram of sampled signals of a pixel cell according to an embodiment of the present disclosure.

FIG. 4 is a time sequence diagram of sampled signals of a pixel cell according to an embodiment of the present disclosure, in which RST represents the resetting signal, TX represents the control signal of the pass transistor 107, SHR represents the first sampled control signal, i.e., the first collected voltage signal, and SHS represents the second sampled control signal, i.e., the second collected voltage signal.

Figure 5A:
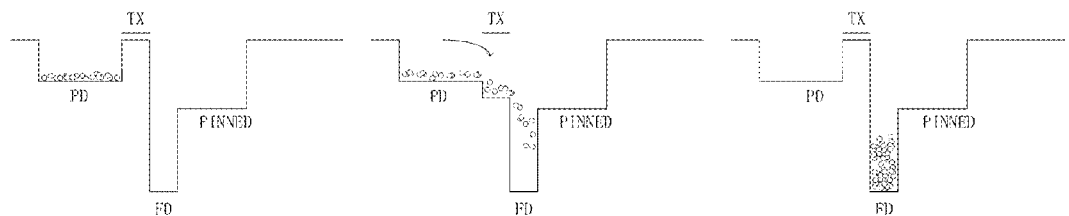
FIG. 5a is an illustration of an electron transfer in a pixel cell under a low luminance according to an embodiment of the present disclosure.
Figure 5B:
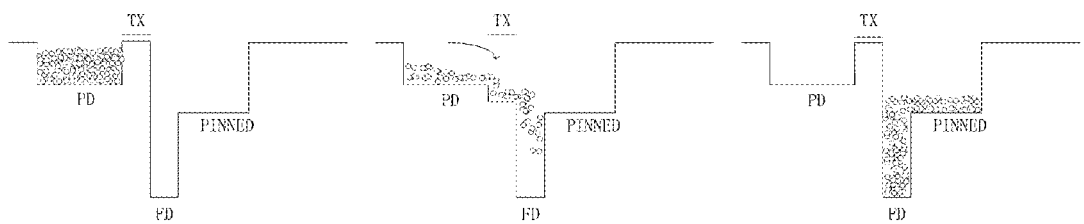
FIG. 5b is an illustration of an electron transfer of a pixel cell under a high luminance according to an embodiment of the present disclosure.

FIG. 5a is an illustration of an electron transfer in a pixel cell under a low luminance according to an embodiment of the present disclosure. As shown in FIG. 5a, when a light signal is small, fewer photon-generated carriers are generated. When the pass transistor 107 is turned on, fewer carriers are transferred to the floating diffusion structure 104. Thus, a voltage drop generated by a unit of electron is large, and the pixel cell is considered to have a high sensitivity. FIG. 5b is an illustration of an electron transfer in a pixel cell under a high luminance according to an embodiment of the present disclosure. As shown in FIG. 5b, when the light signal is large, more photon-generated carriers are generated, and more carriers are transferred to the floating diffusion structure 104. When the voltage of the floating diffusion structure 104 is smaller than the depletion voltage of the PINNED structure 105, the carriers in the floating diffusion structure 104 are transferred into the PINNED structure 105. Meanwhile, the voltage of the floating diffusion structure 104 decreases, and the sensitivity of the image sensor becomes lower (compared with the situation when the light signal is small, the voltage drop generated by a unit of electron decreases, and thus the sensitivity of the image sensor decreases), thus realizing the nonlinear sensitivity of the image sensor. It should be noted that the depletion voltage of the PINNED structure 105 refers to the voltage when the carriers in the first diffusion region 1051 are depleted completely. When the exposure time is short, the sensitivity of the image sensor is high. When the exposure time is long, the signal electrons generated by the photodiode 103 are transferred into the floating diffusion structure 104, and when the voltage of the floating diffusion structure 104 is lower than the depletion voltage of the PINNED structure 105, the sensitivity of the image sensor becomes lower.

Figure 6A:
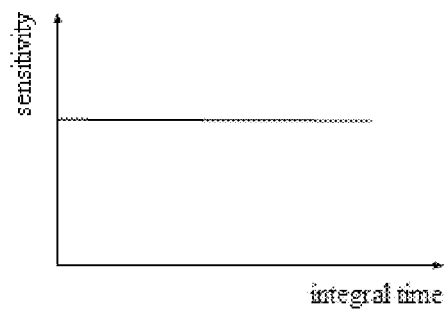
FIG. 6a is a sensitivity curve diagram of a conventional image sensor.
Figure 7A:
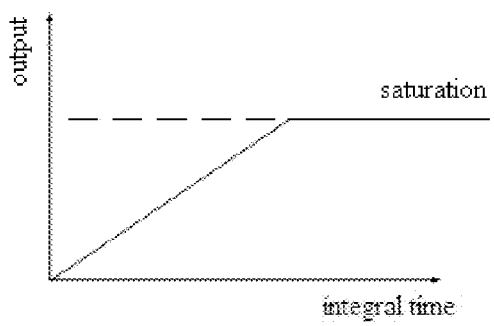
FIG. 7a is an output curve diagram of a conventional image sensor.

FIG. 6a is a sensitivity curve diagram of a conventional image sensor. As shown in FIG. 6a, when the conventional image sensor works, the sensitivity keeps unchanged. With an increment of integral time, the luminance of a bright region and a dark region in the same image increase simultaneously, and an output curve thereof is shown in FIG. 7a. In order to reach a certain luminance, the integral time may be shortened or prolonged, which results in that the bright region is over exposed when the dark region is made bright, or the dark region is made darker when the bright region is made dark, thus making the dynamic range of the image relatively small.

Figure 6B:
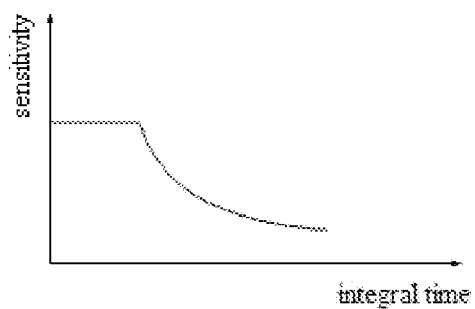
FIG. 6b is a sensitivity curve diagram of an image sensor according to an embodiment of the present disclosure.
Figure 7B:
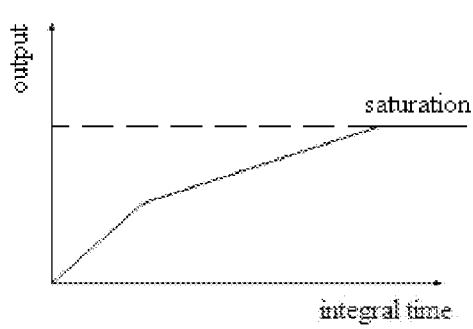
FIG. 7b is an output curve diagram of an image sensor according to an embodiment of the present disclosure.

FIG. 6b is a sensitivity curve diagram of a pixel cell according to an embodiment of the present disclosure. As shown in FIG. 6a, when the integral time is short, the sensitivity keeps unchanged. In other words, when fewer electrons are accumulated, the accumulated electrons are completely transferred to the floating diffusion structure 104. With the increment of integral time, the sensitivity decreases. In other words, the electrons are not only transferred to the floating diffusion structure 104, but also transferred to the PINNED structure 105. The PINNED structure 105 realizes a share of the electrons, thus forming the output curve shown in FIG. 7b. With the increment of the luminance, the sensitivity of the pixel cell decreases. For the dark region of the image, as the sensitivity is relatively high, the luminance thereof is increased. For the bright region of the same image, as the sensitivity is relatively low, the luminance thereof is decreased. Thus, the over-exposure of the image is prevented, and the visibility of the dark region of the image is improved, thus realizing the wide dynamic range of the pixel cell.

According to embodiments of the present disclosure, a method for manufacturing the pixel cell is also provided. Firstly, a substrate is provided, and then a photodiode, a pass transistor, a floating diffusion structure and a PINNED structure are respectively formed on the substrate. The pass transistor is formed between the photodiode and the floating diffusion structure. The floating diffusion structure is connected with the PINNED structure. A reset voltage of the floating diffusion structure is higher than a depletion voltage of the PINNED structure. A resetting transistor, a source following transistor, and a row selected transistor are also formed on the substrate. Specifically, an active region is formed by photolithography in the substrate, and the photodiode, the pass transistor, the floating diffusion structure, the resetting transistor, the row selected transistor, the source following transistor and the PINNED structure are formed in the active region. The detailed forming processes of the photodiode, the pass transistor, the resetting transistor, the row selected transistor, and the source following transistor are well known for those skilled in the art and are omitted herein.

In one embodiment of the present disclosure, the floating diffusion structure is heavily doped, and a doping type of the floating diffusion structure is opposite to that of the substrate. Specifically, a photoresist is coated on the substrate, a mask is used to cover the photoresist, and then the photoresist uncovered by the mask is exposed and developed to obtain an ion implantation region. Subsequently, ions are implanted into the ion implantation region. After the diffusion of the ions, an annealing is performed so as to form the floating diffusion structure. In one embodiment of the present disclosure, the doping concentration of the floating diffusion structure is 10e15/cm2.

According to one embodiment, the PINNED structure comprises a first diffusion region and a second diffusion region, and the forming method thereof comprises the following steps.

Firstly, the first diffusion region is formed in the region connected with the floating diffusion structure. An area of the first diffusion region is larger than that of the floating diffusion structure. In one embodiment, the area of the first diffusion region is smaller than an active region area of the PINNED structure, a doping concentration of the first diffusion region is lower than that of the floating diffusion structure, and a doping type of the first diffusion region is opposite to that of the substrate. The first diffusion region may be formed by the same process as the floating diffusion structure. Specifically, a photoresist is coated on the region connected with the floating diffusion structure, a mask is used to cover the photoresist, and then the photoresist uncovered by the mask is exposed and developed to obtain an ion implantation region. Subsequently, ions are implanted into the ion implantation region. Then, an annealing is performed after the diffusion of the ions so as to form the first diffusion region. In one embodiment, the doping concentration of the first diffusion region is 10e12/cm2. A shape of the first diffusion region may be, but is not limited to, a polygon, a circle, a shape formed with lines and arcs or a shape formed with irregular arcs.

Then, the second diffusion region is formed on the first diffusion region. A thickness of the second diffusion region is smaller than that of the first diffusion region, an area of the second diffusion region is larger than that of the first diffusion region, a doping concentration of the second diffusion region is higher than that of the first diffusion region, and a doping type of the second diffusion region is the same as that of the substrate. The second diffusion region may be formed by the same process as the first diffusion region, and the detailed description thereof is omitted here. In one embodiment of the present disclosure, the doping concentration of the second diffusion region is 10e13/cm2. A shape of the second diffusion region may also be, but is not limited to, a polygon, a circle, a shape formed with lines and arcs or a shape formed with irregular arcs. The shape of the second diffusion region may be different from or the same as that of the first diffusion region.

Alternatively, the floating diffusion structure may be formed after forming the PINNED structure. In another alternative embodiment, the step of forming the floating diffusion structure, and the step of forming the PINNED structure may be performed independently, or performed concurrently with the step of forming the doping region for the photodiode, the pass transistor, the resetting transistor, the source following transistor, or the row selected transistor.

With the method for manufacturing the pixel cell according to embodiments of the present disclosure, by forming the PINNED structure in the region connected with the floating diffusion structure and by controlling the depletion voltage of the PINNED structure, the nonlinear sensitivity of the image sensor is realized and the dynamic range of the image sensor is improved. In addition, the method for manufacturing the pixel cell according to embodiments of the present disclosure is simple to carry out and is compatible with conventional CMOS manufacture methods.

Figure 8:
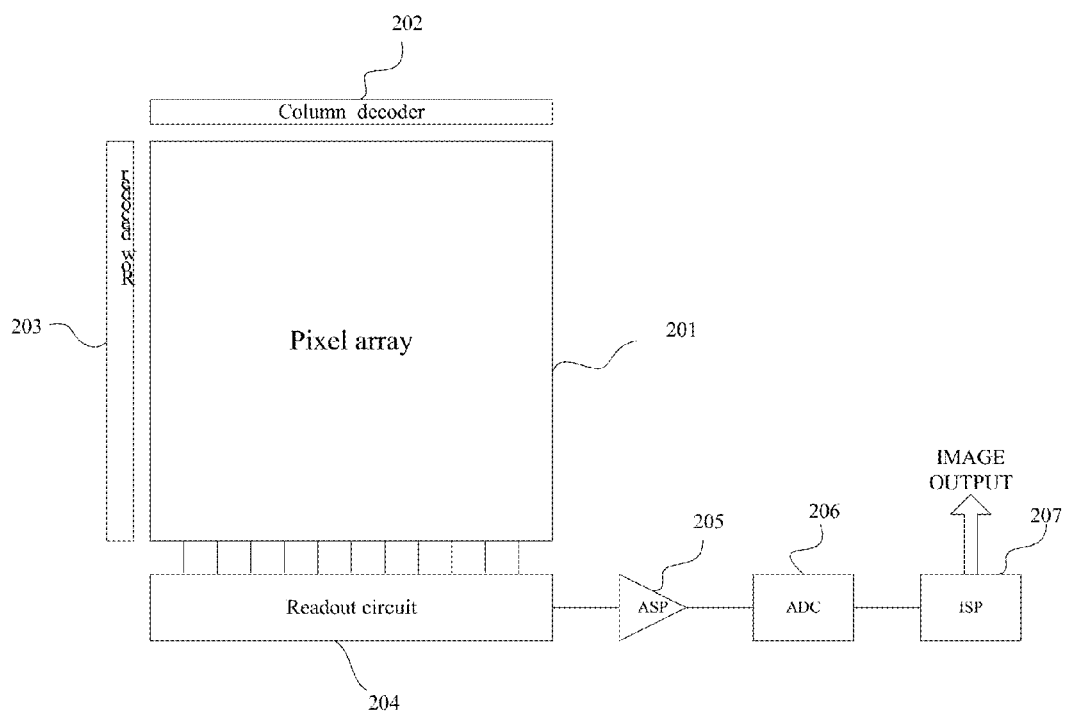
FIG. 8 is a schematic diagram of an image sensor according to an embodiment of the present disclosure.

According to embodiments of the present disclosure, an image sensor is also provided. FIG. 8 is a schematic diagram of an image sensor according to an embodiment of the present disclosure. As shown in FIG. 8, the image sensor comprises a pixel array 201, a column decoder 202, a row decoder 203, a readout circuit 204, a front-end processing circuit 205, a converter 206 and an image signal processing circuit 207. The pixel array 201 comprises a plurality of pixel cells described above arranged in a plurality of rows and columns. The row decoder 203 and the column decoder 202 are connected with the pixel array 201 respectively and configured to select a pixel cell from the plurality of pixel cells. The readout circuit 204 is connected with the pixel array 201 and configured to read a voltage of the pixel cell selected by the column decoder 202 and the row decoder 203. The front-end processing circuit 205 is connected with the readout circuit 204 and configured to process the voltage of the pixel cell to obtain a processed analog voltage. The converter 206 is connected with the front-end processing circuit 205 and configured to convert the processed analog voltage into digital data. The image signal processing circuit 207 is connected with the converter 206 and configured to process the digital data to obtain an image signal. Then, the image signal is transmitted to an image display device for displaying an image. In another embodiment, the image signal processing circuit 207 may be connected with a storage unit for storing the digital data obtained by the converter 206.

With the image sensor according to embodiments of the present disclosure, by using the pixel array comprising the plurality of pixel cells having the PINNED structure, the nonlinear sensitivity of the image sensor is realized. Moreover, the control of the image sensor on the over-exposure region is enhanced, and the visibility of the dark-state region is improved, thus enhancing the dynamic range of the image sensor.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments can not be construed to limit the present disclosure, and changes, alternatives, and modifications can be made in the embodiments without departing from spirit, principles and scope of the present disclosure.

What is claimed is:

1. A pixel cell, comprising:
   a substrate having an active region;
   a photodiode, a pass transistor, and a floating diffusion structure respectively formed on the active region of the substrate, wherein the pass transistor is formed between the photodiode and the floating diffusion structure; and
   a PINNED structure including a first diffusion region and a second diffusion region formed on the active region of the substrate and connected with the floating diffusion structure, wherein a reset voltage of the floating diffusion structure is higher than a depletion voltage of the PINNED structure, wherein:
   the second diffusion region formed on the first diffusion region, a doping type of the first diffusion region is different from that of the substrate, a doping type of the second diffusion region is the same as that of the substrate, a doping concentration of the second diffusion region is larger than that of the first diffusion region, and a shape of the first diffusion region is the same as that of the second diffusion region, and
   the pass transistor is selectively turned on to allow carriers generated by the photodiode to transfer to the PINNED structure to realize a non-linear sensitivity of the pixel cell.

2. The pixel cell according to claim 1, wherein a shape of the PINNED structure is a polygon, a circle, a shape formed with lines and arcs or a shape formed with irregular arcs.

3. The pixel cell according to claim 1, wherein an area of the PINNED structure is larger than that of the floating diffusion structure.

4. The pixel cell according to claim 1, wherein a doping concentration of the floating diffusion structure is larger than that of the first diffusion region, and a doping type of the floating diffusion structure is different from that of the substrate.

5. The pixel cell according to claim 3, wherein a ratio of the area of the PINNED structure to that of the floating diffusion structure ranges from 5:1 to 10:1.

6. A method for manufacturing a pixel cell, comprising:
   providing a substrate having an active region; and
   forming a photodiode, a pass transistor, a floating diffusion structure and a PINNED structure on the substrate respectively on the active region of the substrate, wherein the pass transistor is formed between the photodiode and the floating diffusion structure, the floating diffusion structure is connected with the PINNED structure, a doping type of the floating diffusion structure is different from that of the substrate, and a reset voltage of the floating diffusion structure is higher than a depletion voltage of the PINNED structure, wherein forming the PINNED structure on the substrate comprises:
   forming a first diffusion region in a region connected with the floating diffusion structure, in which an area of the first diffusion region is larger than that of the floating diffusion structure, a doping concentration of the first diffusion region is less than that of the floating diffusion structure, and a doping type of the first diffusion region is different from that of the substrate, comprises:
    coating a photoresist on the region connected with the floating diffusion structure;
    covering the photoresist with a mask;
    exposing and developing the photoresist uncovered by the mask to obtain an ion implantation region;
    implanting ions into the ion implantation region; and
    performing an annealing process after a diffusion of the ions to obtain the first diffusion region; and
  forming a second diffusion region on the first diffusion region, in which a doping concentration of the second diffusion region is larger than that of the first diffusion region, and a doping type of the second diffusion region is the same as that of the substrate, the first and second diffusion regions constituting the PINNED structure;
  wherein the pass transistor is configured to be selectively turned on to allow carriers generated by the photodiode to transfer to the PINNED structure to realize a non-linear sensitivity of the pixel cell.

7. The method according to claim 6, wherein an area of the PINNED structure is larger than that of the floating diffusion structure.

8. The method according to claim 6, wherein a shape of the PINNED structure is a polygon, a circle, a shape formed with lines and arcs or a shape formed with irregular arcs.

9. The method according to claim 7, wherein a ratio of the area of the PINNED structure to that of the floating diffusion structure ranges from 5:1 to 10:1.

10. An image sensor, comprising:
  a pixel array comprising a plurality of pixel cells arranged in a plurality of rows and columns;
  a column decoder and a row decoder, connected with the pixel array respectively and configured to select a pixel cell from the plurality of pixel cells;
  a readout circuit, connected with the pixel array and configured to read a voltage of the pixel cell selected by the column decoder and the row decoder;
  a front-end processing circuit, connected with the readout circuit and configured to process the voltage of the pixel cell to obtain a processed analog voltage;
  a converter, connected with the front-end processing circuit and configured to convert the processed analog voltage into a digital data; and
  an image signal processing circuit, connected with the converter and configured to process the digital data to obtain an image signal,
  wherein the pixel cell includes:
    a substrate having an active region;
    a photodiode, a pass transistor, and a floating diffusion structure respectively formed on the active region of the substrate, wherein the pass transistor is formed between the photodiode and the floating diffusion structure; and
  a PINNED structure including a first diffusion region and a second diffusion region formed on the active region of the substrate and connected with the floating diffusion structure, wherein the second diffusion region formed on the first diffusion region, a doping type of the first diffusion region is different from that of the substrate, a doping type of the second diffusion region is the same as that of the substrate, and a doping concentration of the second diffusion region is larger than that of the first diffusion region,
    wherein a reset voltage of the floating diffusion structure is higher than a depletion voltage of the PINNED structure,
    wherein the pass transistor is selectively turned on to allow carriers generated by the photodiode to transfer to the PINNED structure to realize a non-linear sensitivity of the pixel cell, and
    wherein a shape of the first diffusion region is the same as that of the second diffusion region.

11. The image sensor according to claim 10, wherein an area of the PINNED structure is larger than that of the floating diffusion structure.

12. The image sensor according to claim 10, wherein a doping concentration of the floating diffusion structure is larger than that of the first diffusion region, and a doping type of the floating diffusion structure is different from that of the substrate.

* * * * *